United States Patent [19]

Howell et al.

[11] Patent Number: 4,636,721

[45] Date of Patent: Jan. 13, 1987

[54] METHOD AND STRUCTURE FOR TESTING HIGH VOLTAGE CIRCUITS

[75] Inventors: Robert G. Howell, Chubbuck; Tomas G. Fisher, Pocatello, both of Id.

[73] Assignee: American Microsystems, Inc., Santa Clara, Calif.

[21] Appl. No.: 630,542

[22] Filed: Jul. 13, 1984

[51] Int. Cl.$^4$ ............................................. G01R 19/14
[52] U.S. Cl. ......................................... 324/133; 324/51
[58] Field of Search ................... 324/133, 51, 73 PC, 324/72.5; 340/661, 662, 663, 664

[56] References Cited

U.S. PATENT DOCUMENTS

| | | | |
|---|---|---|---|
| 3,525,939 | 8/1970 | Cartmell | 324/133 |
| 3,742,351 | 6/1973 | Palmer et al. | 324/133 X |
| 3,838,339 | 9/1974 | Brandt | 324/133 |
| 4,011,508 | 3/1977 | Gabor | 324/133 |
| 4,110,687 | 8/1978 | Sneed, Jr. | 324/133 |

*Primary Examiner*—Stanley T. Krawczewicz

*Attorney, Agent, or Firm*—Steven F. Caserza; Alan H. MacPherson; Kenneth E. Leeds

[57] ABSTRACT

A unique method and structure is provided for testing high voltage equipment with great accuracy of voltage levels to be measured, repeatability of measured levels from one piece of test equipment to the next, no need for recalibration of test equipment, and sufficiently low current during testing that the test equipment can be powered by the same supply that powers the device under test. The device of this invention can be used to measure not only logical one and logical zero voltage levels of the device under test while under specific loads but can also be used to meausre transition time from one logic state to another.

The circuit of this invention provides an output signal which can have three states reflecting a high logic level from the device under test, a low logic level from the device under test, and an intermediate level indicating that the device under test is in transition from one logic level to another or has failed the test.

16 Claims, 2 Drawing Figures

METHOD AND STRUCTURE FOR TESTING HIGH VOLTAGE CIRCUITS

BACKGROUND OF THE INVENTION

This invention relates to methods for testing electronic circuits and more particularly to methods for quickly and efficiently testing integrated circuit devices having high output voltages.

With the great multitude of new electronic circuits, and particularly integrated circuit devices, and the vast quantities being produced, it has become imperative that efficient means for testing such circuitry be utilized to ensure that only good circuits are sold to customers. Toward this end, a number of manufacturers have been producing and selling computerized electronic test equipment, such as the well-known Sentry ® unit, manufactured and sold by Fairchild Camera and Instrument Corporation. Such electronic test equipment can be programmed to provide a variety of electronic signals to a device under test (DUT) and measure a variety of electrical signals from that device under test, and utilizing this information, determine whether the device under test meets the manufacturer's and customer's specifications. For example, the Sentry tester is capable of providing supply voltages and appropriate address and enable signals (if required to the device under test), and measuring the output signals from the device under test. More particularly, it is important to test the logical 0 ("low") and the logical 1 ("high") output voltage levels of the device under test. It is also important to test these logical 1 and logical 0 voltage levels at maximum load current. In other words, with a low output signal, the device under test must be able to sink a specified amount of current and simultaneously provide a low voltage output signal less than a specified voltage VOL. Conversely, the device under test must be able to source a specified amount of current and simultaneously provide a high voltage output signal greater than a minimum voltage VOH. In many integrated circuits, the logical 1 output signal is a relatively low voltage, typically 5 volts for TTL devices, or slightly greater for other devices. Most computerized test equipment is designed to measure low voltages quite handily; however, these test systems are designed to measure voltages only up to approximately 20 volts, since that is greater than the voltages most commonly encountered in integrated circuit applications.

A new breed of semiconductor devices is currently being manufactured, having significantly greater output voltages than 20 volts. For example, the S4534, and S4535, manufactured by American Microsystems, Inc., have an output voltage of as great as 60 volts. These devices are typically used in such special applications as driving fluorescent displays, and thus are becoming quite popular. However, conventional computerized test equipment does not provide means for accurately measuring such high output voltages. In the past a simple method for measuring output voltage has been to halt the operation of the computer program used to test the device at specific steps in the test program in order to allow an individual to measure the output voltage, by such means as using an oscilloscope or a voltmeter. However, this technique is unfeasible for large scale production where testing might be done quickly, without highly skilled labor, and with good quality.

Another prior art technique for measuring high output voltages is the use of a resistor divider network to divide the high output voltage down to a voltage within the range capable of being accurately measured by computer test equipment. However, the use of a resistor divider has several disadvantages. First, the resolution of the computer test equipment in conjunction with the resistor divider is significantly less than the resolution of the computer test equipment alone. For example, if the resistor divider divides the high output voltage by a factor of 10, the resolution of the computer test equipment in conjunction with the resistor divider is only 1/10th the resolution of the computer test equipment alone. If the resolution of the computer test equipment is ±1 millivolt, then the resolution of the computer test equipment in determining the voltage levels of the device under test is only ±10 millivolts. Another disadvantage of using a resistor divider network is that the resistances of the divider must be highly precise in order to provide a precise division of the high voltage to be measured. Such high precision resistors are very expensive, and are unlikely to yield exactly the desired resistance ratio. Furthermore, if a number of test boards are to be manufactured, it is highly unlikely that each board will exhibit the same division factor, thus requiring recalibration of the computer test system whenever a test board is changed. Furthermore, a single test board may test a plurality of output signals from a device under test, requiring the use of a plurality of resistor dividers, each with their own unique division factor.

SUMMARY

In accordance with this invention a unique method and structure is provided for testing high voltage equipment with great accuracy of voltage levels to be measured, repeatability of measured levels from one piece of test equipment to the next, no need for recalibration of test equipment, and sufficiently low current during testing that the test equipment can be powered by the same supply that powers the device under test. The device of this invention can be used to measure not only logical one and logical zero voltage levels of the device under test while under specific loads, but can also be used to measure transition time from one logic state to another.

The circuit of this invention provides an output signal which can have three states reflecting a high logic level from the device under test, a low logic level from the device under test, and an intermediate level indicating that the device under test is in transition from one logic level to another or has failed the test. The circuit is connected to the positive high voltage supply of the device under test. The test device generates a logical one reference voltage which can be adjusted to a variety of levels, typically a few volts lower than the supply voltage. It also generates a logical zero reference voltage. The circuit has an input terminal connected to the device to be tested and an output terminal which provides three possible output voltages, used in evaluating the device under test. The logical one reference voltage is applied to the noninverting terminal of a logical one comparator. The logical zero reference voltage is applied to the inverting terminal of a logical zero comparator. The relatively high voltage output signal from the logical one comparator is processed through a level shifting capacitor and a squaring transistor to produce a lower voltage logical one output signal in response to a high voltage logical one input signal from the DUT and a still lower voltage logical zero output signal in response to a typically low voltage logical zero input signal from the DUT. The test circuit uses zener diodes to provide accurate breakdown voltages, avoiding the inaccuracy and difficulty of repetition that comes with using a resistor divider network. Zener diodes of two different breakdown voltages are used to accurately provide the three levels of output voltage. Zener diodes between the positive and negative voltage supplies of the logical zero and logical one comparators provide a constant and accurate voltage drop across those comparators for a variety of supply voltages and thus produce an accurate voltage difference between the high and low output of the comparator even for a wide variety of input voltage.

Thus the circuit of this invention provides several advantages over the circuits of the prior art which have been used to test high voltage devices. It produces accurate results quickly, and can be programmed to test a variety of DUT voltage levels under a range of power supply (VBB) voltage levels. The test equipment draws low current and thus can be powered by the power supply used to power the DUT, thus providing a more accurate comparison of the output signals from the DUT. Since high voltage levels are compared by the high voltage comparator and low voltage levels by the low voltage comparator, high accuracy at high voltage with low voltage output of the test device is achieved.

This invention will be more fully understood in light of the following description taken together with the drawings.

DETAILED DESCRIPTION

Figure 1:
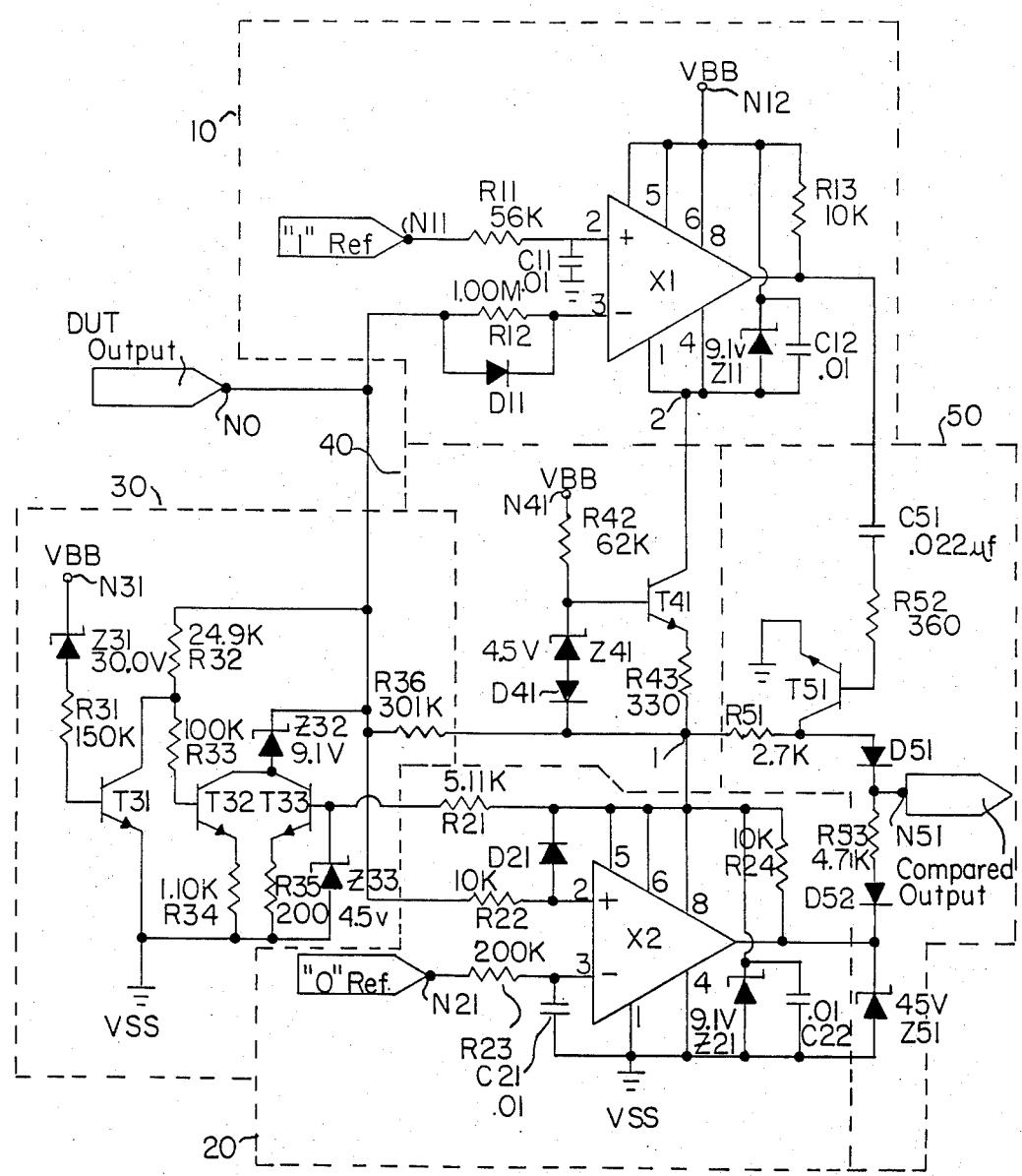
FIG. 1 is a schematic diagram of one embodiment of this invention.

FIG. 1 shows a circuit constructed in accordance with one embodiment of this invention. While this circuit of FIG. 1 will be described in conjunction with certain specified components and resistance values, as well as certain voltage levels corresponding to a specific device under test, it is to be understood that these values serve by way of example only, and are not limitations on the scope of this invention. Those of ordinary skill in the art will appreciate, in light of the teachings of this invention, that this invention may be utilized to test a wide variety of specific devices having high output voltages.

The structure of FIG. 1 includes several subcircuits, and includes terminals N12, N31 and N41 for receiving a voltage supply VBB, a ground reference VSS, terminal N0 for receiving the output signal from the device under test, input terminals N11 and N21 for receiving voltage levels corresponding to a logical 1 and a logical 0, respectively, and output terminal N51 for providing an output signal defining whether the output signal from the device under test which is applied to input terminal N0 is a logical 1, a logical 0, or is switching between the logical 1 and logical 0 states.

Subcircuit 10 is a logical 1 comparison subcircuit and includes voltage comparator X1. Subcircuit 20 is a logical 0 comparison subcircuit and includes voltage comparator X2. Subcircuit 40 is a floating current source, and is used to ensure that the appropriate voltage drops are applied across comparators X1 and X2, regardless of the actual voltage level of VBB.

Subcircuit 30 provides appropriate sourcing and sinking currents to the output terminal of the device under test.

Subcircuit 50 provides three levels of voltage at the output terminal in response to the output signals from the two comparators which respond, under a variety of power supply voltages, to input signals from the device under test.

The structure of this invention requires only a small amount of power, and thus can, if desired, be powered by the same power supply that is being used to power the DUT. Referring to subcircuit 10, VBB input terminal N12 is connected to the positive voltage supply terminal of comparator X1 and to the cathode of zener diode Z11. Zener diode Z11 has a zener breakdown voltage of approximately 9.1 volts, and has its anode connected to the negative power supply terminal of comparator X1 and the input node 2 of floating current source 40. In this manner, the power supply voltage applied to comparator X1 is 9.1 volts. Similarly, comparator X2 has its negative power supply terminal connected to ground and to the anode of zener diode Z21, also having a zener breakdown voltage of approximately 9.1 volts. The positive power supply lead of comparator X2 is connected to the cathode of zener diode Z21 and to output node 1 of floating current source 40, thus insuring that the power supply voltage applied to comparator X2 is a constant 9.1 volts. Capacitors C12 and C22 (0.01 microfarad) are connected across zener diode Z11 and Z21, respectively, in order to eliminate the effects of noise in the power supply voltages applied to voltage comparators X1 and X2.

Floating current source 40 includes NPN transistor T41, having its collector connected to input node 2, its emitter connected through resistor R43 (330 ohms) to output node 1, and its base connected through resistor R42 (62K) to the VBB power supply at terminal C41. The base of transistor T41 is also connected to output node 1 through zener diode Z41, having a zener breakdown voltage of approximately 4.5 volts, and diode D41, having a forward bias voltage drop of approximately 0.7 volts. Thus, zener diode Z41, diode D41, and resistor R42 provide appropriate base drive to transistor T41 such that transistor T41 conducts sufficient current to provide a voltage drop between input node 2 and output node 1 equal to VBB minus the voltage drops across zener diodes Z11 and Z21. For increasing values of VBB, the base drive to transistor T41 increases, the current through transistor T41 increases, and the voltage drop between input node 2 and output node 1 increases. In this manner, a power supply voltage of 9.1 volts is applied to both voltage comparators X1 and X2, regardless of the voltage of VBB. In one particular integrated circuit device VBB, the voltage applied to the integrated circuit under test, can vary between 20 and 60 volts.

Current source 30 provides the appropriate sourcing and sinking currents to the device under test output lead via terminal N0. Resistor R36 (301K) is connected between output node 1 of floating current source 40 and terminal N0. Because node 1 is always at 9.1 volts due to the action of zener diode Z21, resistor R36 provides a current of approximately 25 microamps to output terminal N0 when the device-under-test output signal is a logical 0 of less than approximately 1.25 volts.

Base drive to NPN transistor T33 is supplied by node 1 through resistor R21 (5.11k), and clamped by zener diode Z33 to a maximum base voltage of 4.5 volts, the zener breakdown voltage of zener diode Z33. However, with a logical zero DUT output voltage on terminal N0, zener diode Z32, having a zener breakdown voltage of 9.1 volts, prevents the source current provided by resistor R36 from being shunted to ground through transistors T32 and T33. Likewise, the low output signal of comparator X1 is transmitted via capacitor C51 to the base of transistor T51, turning it off and preventing current provided by resistor R51 from being shunted to ground through transistor T51.

Conversely, when the DUT output signal is a logical 1, (typically approximately 2 volts less than VBB) current is sunk from the DUT output lead through terminal N0, zener diode Z32, transistors T32 and T33, and resistors R34 and R35. As previously described, the power supply voltage VBB can range between 20 and 60 volts. Thus, it is necessary to test the logical 1 output voltage level from the device under test at maximum source current at a power supply voltage VBB of 20 volts and at a power supply voltage VBB of 60 volts. With a logical 1 DUT output signal applied to terminal N0 and VBB equal to 20 volts, zener diode Z31, having a zener breakdown voltage of approximately 30 volts, does not conduct and thus transistor T31 remains turned off, and transistor T32 conducts, providing a combined sink current through transistors T32 and T33 of approximately 25 milliamps. Conversely, with a logical 1 DUT output signal and a VBB voltage of approximately 60 volts, zener diode Z31 breaks down, thus applying base drive to transistor T31 through resistor R31, and turning on transistor T31. With transistor T31 turned on, base drive is not supplied to transistor T32 and transistor T32 turns off. However, due to the increased voltage VBB, transistor T33 sinks approximately 25 milliamps. In this manner, current source 30 sources the desired 25 microamp current to terminal N0 when the output signal applied by the device under test to terminal N0 is a logical 0 and sinks approximately 25 milliamps of current from the DUT output lead connected to terminal N0 when the DUT output signal is a logical 1, regardless of the level of VBB.

Logical 1 comparison subcircuit 10 operates to determine whether the DUT output signal applied to terminal N0 is at least as great as the minimum voltage level (typically VBB minus approximately 2 volts) required for a logical 1 signal. Thus, voltage comparator X1, which comprises, for example, an LM311 device, manufactured by National Semiconductor Corporation, receives on its inverting input lead the DUT output signal from terminal N0 through the parallel combination of resistor R12 (1 megohm) and diode D11. The use of a large value resistor R12 prevents excessive voltage from being applied to the inverting input lead of comparator X1 when the difference between the reference voltage and the DUT output signal is very high. The use of diode D11 allows comparator X1 to respond very quickly to a rising DUT output signal. A logical 1 reference voltage is applied to the noninverting input lead of comparator X1 through resistor R11 (56K). The use of a resistance value of R11 which is significantly less than a resistance value of R12 allows sufficient current to be provided to the noninverting input lead of voltage comparator X1 from the relatively low voltage level of the logical 1 reference voltage in order to allow for a rapid comparison of the DUT output signal and the logical 1 reference voltage. Capacitor C11 (0.01 microfarads) is connected between the noninverting input lead of comparator X1 and ground in order to minimize the effects of noise which has propagated from the reference voltage generating subcircuit 60 of FIG. 2. Resistor R13 (10K) is connected between the positive voltage supply lead and the output lead of voltage comparator X1 in order to serve as pullup means for the open collector output stage of comparator X1. Thus, when the DUT output signal on terminal N0 is less than the logical 1 reference level, the output signal from voltage comparator X1 is a logical 1. Conversely, when the DUT output signal on terminal N0 is greater than the logical 1 reference level, the output signal from voltage comparator X1 is a logical 0.

Logical 0 voltage comparison subcircuit 20 operates in a similar fashion to determine if the voltage of the DUT output signal on terminal N0 is less than the logical 0 reference voltage level. Resistor R24 (10K) is connected between the positive voltage supply lead and the output lead of voltage comparator X2 to serve as a pullup means for the open collector output stage of comparator X2. The noninverting input lead of comparator X2 is connected through resistor R22 (10K) to the DUT output lead connected to terminal N0. Diode D21 is connected between the noninverting input lead of voltage comparator X2 and the positive voltage supply lead of comparator X2 in order to prevent the voltage on inverting input lead of comparator X2 from ever exceeding the zener breakdown voltage of zener diode Z21 plus the forward biased voltage drop of diode D21. Thus, the voltage applied to the noninverting input lead of voltage comparator X2 is never permitted to exceed approximately 9.8 volts in order to prevent damage to voltage comparator X2. The voltage level defining the maximum voltage allowable for a logical 0 signal is applied to the inverting input lead of voltage comparator X2 through resistor R23 (200K). Capacitor C21 (0.01 microfarad) is connected between the inverting input lead of voltage comparator X2 and ground in order to eliminate the effects of noise. Thus, when the DUT output signal on terminal N0 is less than the logical 0 reference voltage, the output signal from voltage comparator X2 is a logical 0 and is approximately zero volts. Conversely, when the DUT output signal on terminal N0 is greater than the logical 0 reference voltage on terminal N21, the output signal from voltage comparator X2 is a logical 1 and is approximately 9.1 volts.

Output stage 50 serves to combine the output signals from voltage comparators X1 and X2 in order to provide a three-state output signal on terminal N51. The output signal on terminal N51 can have three possibel states, as shown in Table I. A low voltage output signal of approximately 2.0 volts indicates that the output signal of the device under test is a logical 0. A high voltage output signal of approximately 8.5 volts indiates that the DUT output signal is a logical 1. An intermediate output signal of approximately 4.5 volts indicates that the device under test output signal is between logical 1 and logical 0 states. Capacitor C51 (0.022 microfarad) and resistor R52 (360 ohms) serve as a level shifter in order to bring the relatively high voltage output signals from the logical 1 voltage comparator subcircuit 10 to a voltage level closer to the output voltage levels provided by the logical 0 voltage comparator in subcircuit 20. Since the operation of the device under test, and thus the operation of voltage comparator X1, is at a very high rate of speed, capacitive coupling provided by capacitor C51 is sufficient for level shifting purposes. Resistor R51 (2.7K) and transistor T51 serve to square the signal provided by the level shift combination of capacitor C51 and R52. Thus, the voltage available on output terminal N51 from transistor T51 varies from a minimum of approximately 2.0 volts to a maximum of approximately 8.5 volts.

There are three possible output states from voltage comparators X1 and X2. First, if the DUT output signal applied to terminal N0 is a logical 1, the output signal from voltage comparator X1 is low and the output signal from voltage comparator X2 is high, thereby providing an output voltage of approximately 8.5 volts on output terminal N51. Secondly, if the DUT output signal is a logical 0, the output signal from voltage comparator X1 is high and the output signal from voltage comparator X2 is low, thereby providing an output voltage of approximately 2.0 volts on output terminal N51. Thirdly, if the DUT output signal is switching between a logical 1 and logical 0 state, or if the device fails by providing a voltage between the "0" and "1" reference voltages, then the output signals from voltage comparators X1 and X2 are both high, thereby providing an output voltage of approximately 4.5 volts.

Figure 2:
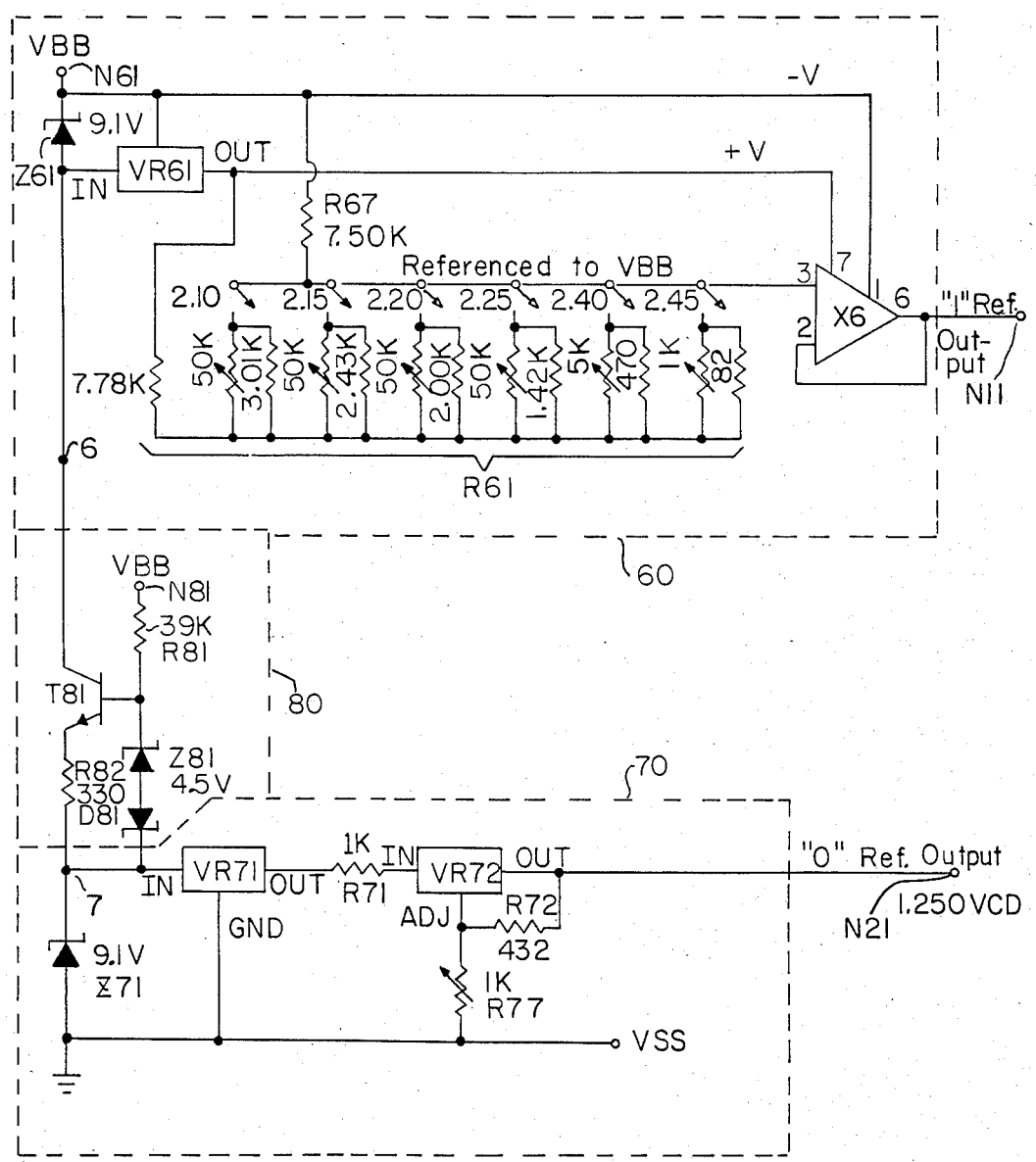
FIG. 2 is a schematic diagram of a circuit used to provide voltage levels corresponding to a logical 0 and a logical 1 which is constructed in accordance with one embodiment of this invention.

As previously described, the logical 1 and logical 0 reference voltages can be provided by any well-known means. One means which is particularly useful with this invention wherein VBB will vary, and wherein the logical 1 reference voltage is slightly less than VBB, is shown in the schematic diagram of FIG. 2. In this embodiment, it is desirable to have a plurality of possible voltage levels corresponding to a logical 1 voltage level. As shown in FIG. 2, these voltage levels are, in this embodiment, 2.100 volts, 2.150 volts, 2.200 volts, 2.250 volts, 2.400 volts, and 2.450 volts less than VBB, any one of which is selected as desired. Naturally, other logical 1 voltage levels can be provided, if desired. The supply voltage VBB is provided on terminal N61. Zener diode Z71 provides a constant 9.1 volt supply voltage on node 7. Similarly, zener diode Z61 provides a constant supply voltage on node 6 equal to VBB minus 9.1 volts. Floating current source 80 operates in a similar fashion to floating current source 40 of FIG. 1 in order to provide a voltage drop between nodes 6 and 7 equal to VBB minus the voltage drops of zener diodes Z61 and Z71. Voltage regulator VR61 (a 7905 device, such as manufactured by National), receives the voltage VBB and the voltage on node 6 and provides an output voltage equal to VBB-5 volts. This output voltage serves as the negative voltage applied to resistor bank R61, with VBB serving as the positive supply voltage. The plurality of switches of resistor bank R61 is used to select which pair of resistors is to form the resistance divider in order to provide a selected reference voltage below VBB to the noninverting input lead of operational amplifier X6. The output lead of operational amplifier X6 is connected to its inverting input lead, thereby causing operational amplifier X6 to operate as a unity gain buffer which provides on its output lead N11 the selected reference voltage level corresponding to a logical one. In a similar fashion, the 9.1 volt supply voltage on node 7 is applied to the input lead of voltage regulator VR71 (a 7805 device, such as manufactured by National Semiconductor), which provides a 5 volt level on its output lead which is applied to the input lead of voltage regulator VR72 (a LM317 device such as manufactured by National) which in turn provides a reference output voltage corresponding to a logical zero level. The actual voltage level of the logical zero reference level is adjusted by variable resistor R77 (1K ohm) as desired to an accuracy of 1 millivolt.

The specific embodiments of this invention described in this specification are intended to serve by way of example and are not a limitation on the scope of my invention. Numerous other embodiments of this invention will become apparent to those of ordinary skill in the art in light of the teachings of this specification.

TABLE I

| DUT Output | Logical 1 Comparator X1 Output | Logical 0 Comparator X2 Output | Transistor T51 | Output On Terminal N51 |
|---|---|---|---|---|
| 0 (below "0" ref) | 1 | 0 | on | ~2.0 volts |
| 1 (above "1" ref) | 0 | 1 | off | ~8.5 volts |
| Transistion (between "0" and "1" ref) | 1 | 1 | on | ~4.5 volts |

We claim:
1. A circuit for generating a low voltage output signal showing the state of a potentially high voltage input signal, comprising
  a first terminal for receiving a first supply voltage;
  a second terminal for receiving a second supply voltage;
  an input terminal for receiving an input signal to be tested;
  a third terminal for receiving a logical 1 reference voltage;
  a fourth terminal for receiving a logical 0 reference voltage; and
  an output terminal for providing an output signal capable of having a first state when said input signal is greater than said logical 1 reference voltage, a second state when said input signal is less than said logical 0 reference voltage, and a third state when said input signal is between said 1 and 0 reference voltages.
2. Structure as in claim 1 including:
  logical 1 voltage comparison means for generating a logical 1 voltage comparison output signal having a first selected voltage when said input signal has a lower voltage than said logical 1 reference voltage, and having a second selected voltage when said input signal has a higher voltage than said logical 1 reference voltage, said logical 1 voltage comparison means being connected to said input terminal and to said third terminal, and having a logical 1 comparison output terminal;
  logical 0 voltage comparison means for generating a logical 0 voltage comparison output signal having a third selected voltage when said input signal has a higher voltage than said logical 0 reference voltage, and having a fourth selected voltage when said input signal is less than said logical 0 reference voltage, said logical 0 voltage comparison means being connected to said input terminal and to said fourth terminal, and having a logical 0 comparison output terminal;
  output means for receiving said logical 1 voltage comparison output signal from said logical 1 comparison output terminal and said logical 0 voltage comparison output signal from said logical 0 comparison output terminal and providing said output signal in response thereto.

3. Structure as in claim 2 wherein said logical 0 voltage comparison means comprises a logical 0 voltage comparator having a noninverting input terminal connected to said input terminal, and an inverting input terminal connected to said fourth terminal for receiving a logical 0 reference voltage.

4. Structure as in claim 2 wherein said logical 1 voltage comparison means comprises a logical 1 voltage comparator having a noninverting input terminal connected to said third terminal for receiving a logical 1 reference voltage, and an inverting input terminal connected to said input terminal.

5. Structure as in claim 2 wherein:
said logical 0 voltage comparison means comprises a logical 0 voltage comparator having a noninverting input terminal connected to said input terminal, and an inverting input terminal connected to said fourth terminal for receiving a logical 0 reference voltage; and
said logical 1 voltage comparison means comprises a logical 1 voltage comparator having a noninverting input terminal connected to said third terminal for receiving a logical 1 reference voltage, and an inverting input terminal connected to said input terminal.

6. Structure as in claim 5 where said output means comprises:
a first zener diode having its cathode connected to said first terminal and to the positive supply terminal of said logical 1 voltage comparator, and its anode connected to the negative supply terminal of said logical 1 voltage comparator;
a first transistor having a first current carrying terminal connected to said negative supply terminal of said logical 1 voltage comparator, a second current carrying terminal connected to the positive supply terminal of said logical 0 voltage comparator, and a control terminal connected through resistive means to said first terminal;
a second zener diode having its cathode connected to said positive supply terminal of said logical 0 voltage comparator and its anode connected to the negative supply terminal of said logical 0 voltage comparator and to said second terminal;
a third zener diode and a first diode connected in series between said control terminal of said first transistor and said positive supply terminal of said logical 0 voltage comparator, said third zener diode having its cathode oriented toward said control terminal of said first transistor, and said first diode having its anode oriented toward said control terminal of said first transistor;
a capacitor having a first plate connected to said logical 1 comparison output terminal and having a second plate;
a second transistor having a first current carrying terminal connected to said second terminal, a second current carrying terminal, and a control terminal connected to said second plate of said capacitor;
a second diode having its anode connected to said positive supply terminal of said logical 0 voltage comparison means and the second current carrying terminal of said second transistor and its cathode connected to said output terminal;
a third diode having its anode connected to said output terminal for providing an output signal and its cathode connected to said output terminal of said logical 0 voltage comparator; and
a fourth zener diode having its cathode connected to said output terminal of said logical 0 voltage comparator and its anode connected to said second terminal.

7. Structure as in claim 2 where said output means for receiving said logical 1 voltage comparison output signal from said logical 1 comparison output terminal and said logical 0 voltage comparison output signal from said logical 0 comparison output terminal and providing said output signal in response thereto comprises:
means for sourcing current to said output terminal;
means for shunting said current sourced to said output terminal; and
means for sinking current from said output terminal.

8. Structure as in claim 7 where said means for sourcing current to said output terminal comprises a node provided to be a specified voltage level above said second supply voltage, said specified level being approximately equal to a desired level for indicating a logical 1 output voltage; and said means for shunting said current comprises a transistor connecting said node to said second supply voltage, said transistor being controlled by said logical 1 comparison output terminal.

9. Structure as in claim 7 wherein said means for sinking current from said output terminal comprises means for pulling the voltage level at said output terminal to a selected intermediate level between said desired level for indicating a logical 1 output voltage and said second supply voltage when said means for sinking is not sinking current; and pulling the voltage level at said output terminal to a low level near said second supply voltage when said means for sinking is sinking current.

10. Structure as in claim 9 wherein said means for pulling the voltage level to a selected intermediate level or to a low level near said second supply voltage comprises providing a zener diode having a breakdown voltage of approximately said intermediate level with its anode connected to said second supply voltage terminal and its cathode connected to the output terminal of said logical 0 voltage comparison means and also through resistive means to said output terminal for providing an output signal.

11. Structure as in claim 7 where, in response to said input signal being higher than said logical 1 reference voltage said means for shunting said current does not shunt said current and said means for sinking current does not sink said current; in response to said input signal being lower than said logical 0 reference voltage said means for shunting said current shunts said current and said means for sinking current sinks said current; and in response to said input signal being between said logical 1 and 0 reference voltages said means for shunting said current shunts said current but said means for sinking current does not sink said current.

12. A circuit for generating logical 1 and logical 0 reference voltages, including a first voltage supply terminal providing a first voltage supply and a second voltage supply terminal providing a second voltage supply, comprising:
means for generating a logical 1 reference voltage, including
a fist terminal connected to said first voltage supply terminal;
a second terminal;
an output terminal for providing said logical 1 reference voltage;

means connected to said first and second terminals for generating a third voltage having a level between the levels of said first and said second voltage supplies and having a constant voltage difference from said first voltage supply regardless of the values of said first and said second voltage supplies; and means for receiving said third voltage and generating said logical 1 reference voltage intermediate between said first voltage supply and said third voltage;

means for generating a logical 0 reference voltage, including a first terminal connected to said second voltage supply terminal;

a second terminal;

means for generating a fourth voltage having a level between the levels of said first and said second voltage supplies and having a constant voltage difference from said second voltage supply regardless of the values of said first and said second voltage supplies;

an output terminal for providing said logical 0 reference voltage; and means for receiving said fourth voltage and generating said logical 0 reference voltage intermediate between said fourth voltage and said second voltage supply; and means for providing a variable voltage drop between said second terminals of said means for generating said logical 1 and said logical 0 reference voltages in response to a variable voltage drop between said first voltage supply and said second voltage supply.

13. Structure as in claim 12 wherein said means for generating said third voltage is a first voltage regulator, having one input terminal connected to said first voltage supply terminal and another input terminal connected to the anode of a first zener diode having its cathode connected to said first voltage supply terminal, and said means for generating said fourth voltage is a second voltage regulator having one input terminal connected to said second voltage supply terminal and another input terminal connected to the cathode of a second zener diode having its anode connected to said second voltage supply terminal.

14. Structure as in claim 12 wherein said means for generating said logical 1 reference voltage comprises a first resistor, a second resistor, a voltage regulator, a zener diode, and a voltage comparator;

said first resistor being connected between said first voltage supply terminal and the noninverting terminal of said voltage comparator, said zener diode having its anode connected to said first voltage supply terminal and its cathode connected to said second terminal of said first means and to the input terminal of said voltage regulator, said voltage regulator having its ground terminal connected to said first voltage supply terminal and its output terminal connected to a first lead of said second resistor, a second lead of said second resistor being connected to said noninverting terminal of said voltage comparator, said voltage comparator having its positive supply terminal connected to said output terminal of said voltage regulator, its negative supply terminal connected to said first voltage supply terminal, and its output terminal connected to its inverting input terminal and to said output terminal for providing a logical 1 reference voltage.

15. Structure as in claim 12 where said means for generating a logical 0 reference voltage comprises a first voltage regulator, a second voltage regulator, a zener diode, a first resistor, a second resistor, and a variable resistor, wherein said first voltage regulator has its input terminal connected to said second terminal of said second means, its ground terminal connected to said second voltage supply terminal, and its output terminal connected through said first resistor to the input terminal of said second voltage regulator, said zener diode has its anode connected to said second terminal of said second means and its cathode connected to said second voltage supply terminal, and said second voltage regulator has its ground terminal connected through said variable resistor to said second voltage supply terminal and through said second resistor to its output terminal, and its output terminal connected to said output terminal for providing a logical 0 reference voltage.

16. Structure as in claim 12 wherein said means for providing a variable voltage drop comprises:

a first resistor, a transistor, a second resistor, a zener diode, and a diode;

said transistor having its control terminal connected through said first resistor to said first voltage supply terminal, its first main current terminal connected to said second terminal of said first means and its second main current terminal connected to said second terminal of said second means;

said zener diode having its anode connected to said control terminal of said transistor and its cathode connected to the cathode of said diode;

said diode having its anode connected to said second terminal of said second means.

* * * * *